(12) United States Patent
Akatsuka et al.

(10) Patent No.: US 11,552,216 B2
(45) Date of Patent: Jan. 10, 2023

(54) LIGHT EMITTING APPARATUS AND PROJECTOR

(71) Applicants: Seiko Epson Corporation, Tokyo (JP); Sophia School Corporation, Tokyo (JP)

(72) Inventors: Yasuto Akatsuka, Chino (JP); Hiroyuki Shimada, Chuo (JP); Koichiro Akasaka, Ina (JP); Katsumi Kishino, Akiruno (JP)

(73) Assignees: SEIKO EPSON CORPORATION; SOPHIA SCHOOL CORPORATION

( * ) Notice: Subject to any disclaimer, the term of this patent is extended or adjusted under 35 U.S.C. 154(b) by 38 days.

(21) Appl. No.: 17/194,427

(22) Filed: Mar. 8, 2021

(65) Prior Publication Data

US 2021/0280740 A1   Sep. 9, 2021

(30) Foreign Application Priority Data

Mar. 9, 2020 (JP) .............................. JP2020-039603

(51) Int. Cl.
*H01L 33/04*   (2010.01)
*H01L 33/52*   (2010.01)
*H01L 33/38*   (2010.01)
*G03B 21/20*   (2006.01)

(52) U.S. Cl.
CPC .......... *H01L 33/04* (2013.01); *G03B 21/2033* (2013.01); *H01L 33/382* (2013.01); *H01L 33/52* (2013.01)

(58) Field of Classification Search
CPC ....... H01L 33/04; H01L 33/382; H01L 33/52; G03B 21/2033
See application file for complete search history.

(56) References Cited

U.S. PATENT DOCUMENTS

| 11,042,079 | B2* | 6/2021 | Itoh ..................... H04N 9/3102 |
| 2003/0123505 | A1 | 7/2003 | Peters et al. |
| 2007/0248132 | A1 | 10/2007 | Kikuchi et al. |

(Continued)

FOREIGN PATENT DOCUMENTS

| JP | 2003-218453 A | 7/2003 |
| JP | 2010-010657 A | 1/2010 |

(Continued)

OTHER PUBLICATIONS

J. T. Leonard et al, "Demonstration of a III-Nitride Vertical-Cavity Surface-Emitting Laser with a III-Nitride Tunnel Junction Intracavity Contact", Applied Physics Letters 107, 091105 1-5 (2015).

*Primary Examiner* — Mark W Tornow
(74) *Attorney, Agent, or Firm* — Harness, Dickey & Pierce, P.L.C.

(57) ABSTRACT

A light emitting apparatus includes an electrode and a laminated structure. The laminated structure includes an n-type first semiconductor layer, a light emitting layer, a p-type second semiconductor layer, a tunnel junction layer, and an n-type third semiconductor layer. The electrode is electrically connected to the first semiconductor layer. The first semiconductor layer, the light emitting layer, the second semiconductor layer, the tunnel junction layer, and the third semiconductor layer are arranged in a presented order. The light emitting layer and the first semiconductor layer form a columnar section.

4 Claims, 5 Drawing Sheets

(56) References Cited

U.S. PATENT DOCUMENTS

| | | | |
|---|---|---|---|
| 2008/0217646 A1* | 9/2008 | Komada | H01L 33/04 |
| | | | 257/101 |
| 2011/0012168 A1 | 1/2011 | Armitage | |
| 2016/0079469 A1* | 3/2016 | Chiu | H01L 33/007 |
| | | | 438/34 |
| 2018/0204977 A1* | 7/2018 | Dheeraj | H01L 31/1852 |
| 2019/0267775 A1* | 8/2019 | Noda | H01S 5/22 |
| 2020/0161504 A1* | 5/2020 | Fimland | H01L 33/0066 |
| 2020/0313038 A1* | 10/2020 | Ishizawa | H01L 33/18 |
| 2020/0313039 A1* | 10/2020 | Ishizawa | H01L 21/0259 |

FOREIGN PATENT DOCUMENTS

| | | |
|---|---|---|
| JP | 2011-040784 A | 2/2011 |
| WO | 2006-025407 A1 | 3/2006 |

\* cited by examiner

ND PROJECTOR

The present application is based on, and claims priority from JP Application Serial Number 2020-039603, filed Mar. 9, 2020, the disclosure of which is hereby incorporated by reference herein in its entirety.

BACKGROUND

Technical Field

The present disclosure relates to a light emitting apparatus and a projector.

Related Art

Semiconductor lasers are expected as a high-luminance, next-generation light source. In particular, a semiconductor laser having a nano-structure called, for example, a nano-column, a nano-wire, a nano-rod, and a nano-pillar, is expected to achieve a light emitting apparatus capable of emitting high-power light having a narrow radiation angle based on a photonic crystal effect.

JP-A-2010-10657 discloses a GaN nano-column LED in which top portions of a plurality of nano-columns formed on a surface of an Si substrate are covered with a transparent electrode. In JP-A-2010-10657, the transparent electrode is made of ITO (indium tin oxide).

In the semiconductor laser including the nano-columns, however, light propagating between the nano-columns cannot be completely confined between cladding layers but leaks to the electrode formed above the nano-columns. Therefore, when the electrode made of ITO is used, the light propagating between the nano-columns is greatly lost due to a large light absorption coefficient of ITO.

SUMMARY

A light emitting apparatus according to an aspect of the present disclosure includes an electrode and a laminated structure. The laminated structure includes an n-type first semiconductor layer, a light emitting layer, a p-type second semiconductor layer, a tunnel junction layer, an n-type third semiconductor layer. The electrode is electrically connected to the first semiconductor layer. The first semiconductor layer, the light emitting layer, the second semiconductor layer, the tunnel junction layer, and the third semiconductor layer are arranged in a presented order. The light emitting layer and the first semiconductor layer form a columnar section.

A projector according to an aspect of the present disclosure has the aspect of the light emitting apparatus.

DESCRIPTION OF EXEMPLARY EMBODIMENTS

Preferable embodiments of the present disclosure will be described below in detail with reference to the drawings. It is not intended that the embodiments described below unduly limit the contents of the present disclosure set forth in the appended claims. Further, all configurations described below are not necessarily essential configuration requirements of the present disclosure.

1. First Embodiment

1.1. Light Emitting Apparatus

Figure 1:
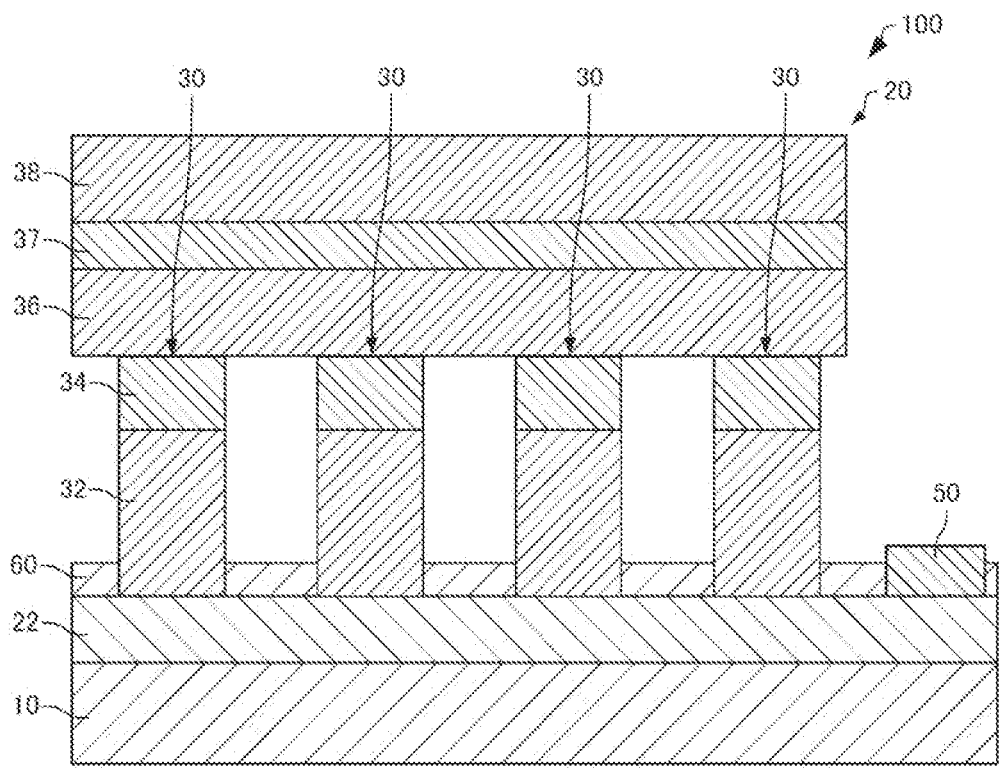
FIG. 1 is a cross-sectional view diagrammatically showing a light emitting apparatus according to a first embodiment.

A light emitting apparatus according to a first embodiment will first be described with reference to the drawings. FIG. 1 is a cross-sectional view diagrammatically showing a light emitting apparatus 100 according to the first embodiment.

The light emitting apparatus 100 includes a base 10, a laminated structure 20, and an electrode 50, as shown in FIG. 1.

The substrate 10 is, for example, an Si substrate, a GaN substrate, or a sapphire substrate.

The laminated structure 20 is provided on the substrate 10. The laminated structure 20 includes a buffer layer 22, first semiconductor layers 32, light emitting layers 34, a second semiconductor layer 36, a tunnel junction layer 37, and a third semiconductor layer 38.

The buffer layer 22, the first semiconductor layers 32, the light emitting layers 34, the second semiconductor layer 36, the tunnel junction layer 37, and the third semiconductor layer 38 are arranged in the presented order from the side facing the substrate 10. That is, the second semiconductor layer 36 is disposed between the first semiconductor layers 32 and the third semiconductor layer 38, the light emitting layers 34 are disposed between the first semiconductor layers 32 and the second semiconductor layer 36, the tunnel junction layer 37 is disposed between the second semiconductor layer 36 and the third semiconductor layer 38, and the first semiconductor layers 32 are disposed between the substrate 10 and the light emitting layers 34.

The buffer layer 22 is provided on the substrate 10. The buffer layer 22 is, for example, an n-type GaN layer to which Si has been doped. A mask layer 60 for forming columnar sections 30 is provided on the buffer layer 22. The mask layer 60 is, for example, a titanium layer, a titanium oxide layer, a silicon oxide layer, or an aluminum oxide layer.

The present specification will be described on the assumption that in a lamination direction of the laminated structure 20 (hereinafter also simply referred to as "lamination direction"), the direction from the light emitting layers 34 as a reference toward the second semiconductor layer 36 is called an "upward direction" and the direction from the light emitting layers 34 as the reference toward the first semiconductor layers 32 is called a "downward direction." The "lamination direction of the laminated structure" refers to the direction in which the first semiconductor layers 32 and the light emitting layers 34 are laminated on each other.

The first semiconductor layers 32 are provided on the buffer layer 22. The first semiconductor layers 32 are provided between the substrate 10 and the light emitting layers 34. The first semiconductor layers 32 are each an n-type semiconductor layer. The first semiconductor layers 32 are each, for example, an n-type GaN layer to which Si has been doped.

The light emitting layers 34 are provided on the first semiconductor layers 32. The light emitting layers 34 are provided between the first semiconductor layers 32 and the second semiconductor layer 36. The light emitting layers 34 produce light when current is injected thereinto. The light emitting layers 34 each have, for example, a multiple quantum well structure in which quantum well structures each formed of an i-type GaN layer and an i-type InGaN layer to each of which no impurity has been doped are layered on each other.

The second semiconductor layer 36 is provided on the light emitting layers 34. The second semiconductor layer 36 is provided between the light emitting layers 34 and the tunnel junction layer 37. The second semiconductor layer 36 is a layer having a conductivity type different from that of the first semiconductor layers 32. The second semiconductor layer 36 is a p-type semiconductor layer. The second semiconductor layer 36 is, for example, a p-type AlGaN layer to which Mg has been doped. The second semiconductor layer 36 may, for example, instead be a p-type GaN layer to which Mg has been doped. The first semiconductor layers 32 and the second semiconductor layer are each a cladding layer having the function of confining the light in the light emitting layers 34.

The tunnel junction layer 37 is provided on the second semiconductor layer 36. The tunnel junction layer is provided between the second semiconductor layer 36 and the third semiconductor layer 38. The tunnel junction layer 37 joins the second semiconductor layer 36 to the third semiconductor layer 38 to each other in the form of a tunnel junction. Current can therefore be injected from the n-type third semiconductor layer 38 into the p-type second semiconductor layer 36. The tunnel junction layer 37 has a film thickness, for example, smaller than or equal to 50 nm. The tunnel junction layer 37 has a visible light absorption coefficient of, for example, about 100 cm$^{-1}$.

Figure 2:
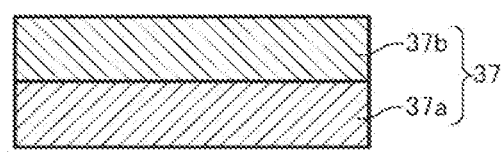
FIG. 2 is a cross-sectional view diagrammatically showing a tunnel junction layer.

FIG. 2 is a cross-sectional view diagrammatically showing the tunnel junction layer 37. The tunnel junction layer 37 includes a first layer 37a and a second layer 37b.

The first layer 37a is provided on the second semiconductor layer 36. The first layer 37a is a p-type semiconductor layer. The first layer 37a is, for example, a p-type GaN layer to which high-concentration Mg has been doped. The Mg concentration of the first layer 37a is higher than the Mg concentration of the second semiconductor layer 36. For example, the Mg concentration of the first layer 37a ranges from $1 \times 10^{19}$ to $1 \times 10^{22}$ cm$^{-3}$, which is higher by about one digit than the Mg concentration of the second semiconductor layer 36. The first layer 37a is not necessarily made of GaN and may, for example, be a nitride semiconductor layer made of AlN, GaN, InN, or a mixed crystal thereof. The dopant doped into the first layer 37a is not limited to Mg and may instead be another p-type dopant.

The second layer 37b is provided on the first layer 37a. The second layer 37b is an n-type semiconductor layer. The second layer 37b is, for example, an n-type GaN layer to which high-concentration Si has been doped. The Si concentration of the second layer 37b is higher than the Si concentration of the first semiconductor layers 32 and the Si concentration of the third semiconductor layer 38. For example, the Si concentration of the second layer 37b ranges from $1 \times 10^{19}$ to $1 \times 10^{22}$ cm$^{-3}$, which is higher by about one digit than the Si concentration of the first semiconductor layers 32. The second layer 37b is not necessarily made of GaN and may, for example, be a nitride semiconductor layer made of AlN, GaN, InN, or a mixed crystal thereof. The dopant doped into the second layer 37b is not limited to Si and may instead be another n-type dopant.

The third semiconductor layer 38 is provided on the tunnel junction layer 37. The third semiconductor layer is an n-type semiconductor layer. The third semiconductor layer 38 is, for example, an n-type GaN layer to which Si has been doped. The third semiconductor layer 38 may, for example, be an n-type AlGaN layer to which Si has been doped. The third semiconductor layer 38 is joined in the form of a tunnel junction to the second semiconductor layer 36 via the tunnel junction layer 37.

The third semiconductor layer 38 functions as an electrode for injecting current into the light emitting layers 34. The third semiconductor layer 38 diffuses the current in the in-plane direction of the laminated structure 20, which is the direction perpendicular to the lamination direction, and supplies the plurality of columnar sections with the current. The light emitting apparatus 100 therefore needs no transparent electrode made, for example, of ITO.

The visible light absorption coefficient of ITO is, for example, about 2000 cm$^{-1}$, which is a large light absorption coefficient. The light absorption coefficient of the tunnel junction layer 37 is smaller than the light absorption coefficient of ITO by about one digit. The light absorption coefficient of the third semiconductor layer 38, which is an n-type GaN layer, is extremely small. The light absorption coefficient of the third semiconductor layer 38, which is an n-type GaN layer, is smaller than the light absorption coefficient of ITO and smaller than the light absorption coefficient of the second semiconductor layer 36, which is a p-type GaN layer.

Therefore, in the light emitting apparatus 100, the third semiconductor layer 38, which is joined in the form of a tunnel junction to the second semiconductor layer 36 via the tunnel junction layer 37, is used as an electrode, whereby loss of the light propagating between the columnar sections 30 can be reduced as compared, for example, with the case where an electrode made of ITO is used.

The electrode 50 is provided on the buffer layer 22. The buffer layer 22 may be in ohmic contact with the electrode 50. The electrode 50 is electrically connected to the first semiconductor layers 32. In the example shown in FIG. 1, the electrode 50 is electrically connected to the first semiconductor layers 32 via the buffer layer 22. The first electrode 50 is one of the electrodes for injecting current into the light emitting layers 34. That is, in the light emitting apparatus 100, the electrode 50 and the third semiconductor layer 38 inject current into the light emitting layers 34. The first electrode 50 is, for example, a laminated structure of a Cr layer, an Ni layer, and an Au layer laminated in the presented order from the side facing the buffer layer 22.

The first semiconductor layers 32 and the light emitting layers 34 form the columnar sections 30. The laminated structure 20 includes a plurality of columnar sections 30. The columnar sections 30 are provided on the buffer layer 22. The columnar sections 30 each have a columnar shape protruding upward from the buffer layer 22. The columnar sections 30 are each also called, for example, a nano-column, a nano-wire, a nano-rod, and a nano-pillar. The columnar sections 30 each have, for example, a polygonal or circular planar shape.

The columnar sections 30 each have a diameter, for example, greater than or equal to 50 nm but smaller than or equal to 500 nm. When the diameter of each of the columnar sections 30 is smaller than or equal to 500 nm, high-quality-crystal light emitting layers 34 can be produced, whereby distortion intrinsically present in the light emitting layers 34 can be reduced. The light produced in the light emitting layers 34 can thus be efficiently amplified. The plurality of columnar sections 30 have, for example, the same diameter.

In a case where the columnar sections 30 each have a circular planar shape, the term "the diameter of the columnar sections" refers to the diameter of the circular shape, and when the columnar sections 30 each have a non-circular planar shape, the term refers to the diameter of a minimum circle containing the non-circular shape therein. For example, when the columnar sections 30 each have a polygonal planar shape, the terms refers to the diameter of a minimum circle containing the polygonal shape therein, and when the columnar sections 30 each have an elliptical planar shape, the term refers to the diameter of a minimum circle containing the elliptical shape therein.

The columnar sections 30 are located at a plurality of locations. The distance between adjacent columnar sections 30 is, for example, greater than or equal to 1 nm but smaller than or equal to 500 nm. The plurality of columnar sections 30 are arranged in a predetermined direction at predetermined intervals in the plan view viewed in the lamination direction. The plurality of columnar sections 30 are arranged in a triangular lattice. The plurality of columnar sections 30 are not necessarily arranged in a specific shape and may be arranged in a square lattice. The plurality of columnar sections 30 can provide the photonic crystal effect.

The "interval between the columnar sections" is the distance between the centers of columnar sections 30 adjacent to each other in the predetermined direction. In the case where the columnar sections 30 each have a circular planar shape, the term "the centers of the columnar sections" each refers to the center of the circle, and when the columnar sections 30 each have a non-circular planar shape, the term refers to the center of a minimum circle containing the non-circular shape therein. For example, when the columnar sections 30 each have a polygonal planar shape, the term refers to the center of a minimum circle containing the polygonal shape therein, and when the columnar sections 30 each have an elliptical planar shape, the term refers to the center of a minimum circle containing the elliptical shape therein.

The second semiconductor layer 36 is a single layer so provided as to extend over the plurality of columnar sections 30. That is, the second semiconductor layer 36 does not form the columnar sections 30. Similarly, the tunnel junction layer 37 is a single layer so provided as to extend over the plurality of columnar sections 30, so that the tunnel junction layer 37 does not form the columnar sections 30. Similarly, the third semiconductor layer 38 is a single layer so provided as to extend over the plurality of columnar sections 30, so that the third semiconductor layer 38 does not form the columnar sections 30.

In the light emitting apparatus 100, each set of the p-type second semiconductor layer 36, the light emitting layer 34, and the n-type first semiconductor layer 32 form a pin diode. In the light emitting apparatus 100, when forward bias voltage for the pin diode is applied to the space between the electrode 50 and the third semiconductor layer 38, current is injected into the light emitting layers 34, whereby electrons and holes recombine with each other in the light emitting layers 34. The recombination causes light emission. The first semiconductor layers 32 and the second semiconductor layer 36 cause the light produced in the light emitting layers 34 to propagate in the in-plane direction perpendicular to the lamination direction and form a standing wave based on the photonic crystal effect provided by the plurality of columnar sections 30, and the standing wave receives gain in the light emitting layers 34 to achieve laser oscillation. The light emitting apparatus 100 then outputs positive first order diffracted light and negative first order diffracted light as the laser light in the lamination direction.

The light emitting apparatus 100 can provide, for example, the following effects and advantages.

In the light emitting apparatus 100, the n-type first semiconductor layers 32, the i-type light emitting layers 34, the p-type second semiconductor layer 36, the tunnel junction layer 37, and the n-type third semiconductor layer 38 are arranged in the presented order from the side facing the substrate 10. In the light emitting apparatus 100, the p-type second semiconductor layer 36 is joined in the form of a tunnel junction to the n-type third semiconductor layer 38 via the tunnel junction layer 37, whereby the n-type third semiconductor layer 38 can inject current into the p-type second semiconductor layer 36 via the tunnel junction layer 37. The third semiconductor layer can therefore be used as an electrode for injecting current into the light emitting layers 34. Since the n-type third semiconductor layer 38 has an extremely small light absorption coefficient, whereby loss of the light propagating between the columnar sections 30 can be reduced as compared, for example, with the case where an electrode made of ITO is used.

For example, even when an electrode made of ITO is used, reducing the thickness of the ITO electrode can reduced the optical loss. A thin electrode, however, results in an increase in electrical resistance and hence deterioration of the characteristics of the pin diodes. In the light emitting apparatus 100, the n-type third semiconductor layer 38 having a small light absorption coefficient is used as the electrode, the optical loss can be reduced even when the thickness of the electrode is not reduced. The light emitting apparatus 100 can therefore be a low-resistance, low-optical-loss light emitting apparatus.

1.2. Method for Manufacturing Light Emitting Apparatus

Figure 3:
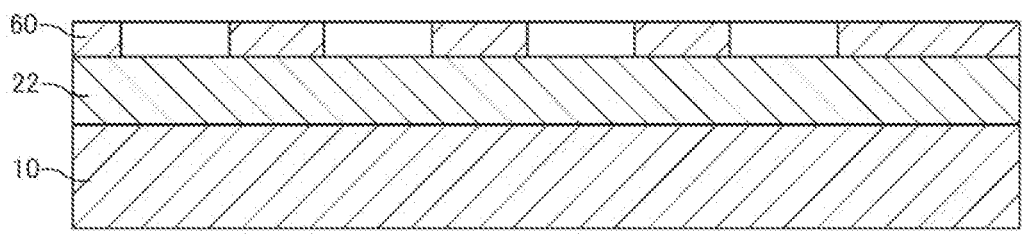
FIG. 3 is a cross-sectional view diagrammatically showing one of the steps of manufacturing the light emitting apparatus according to the first embodiment.
Figure 4:
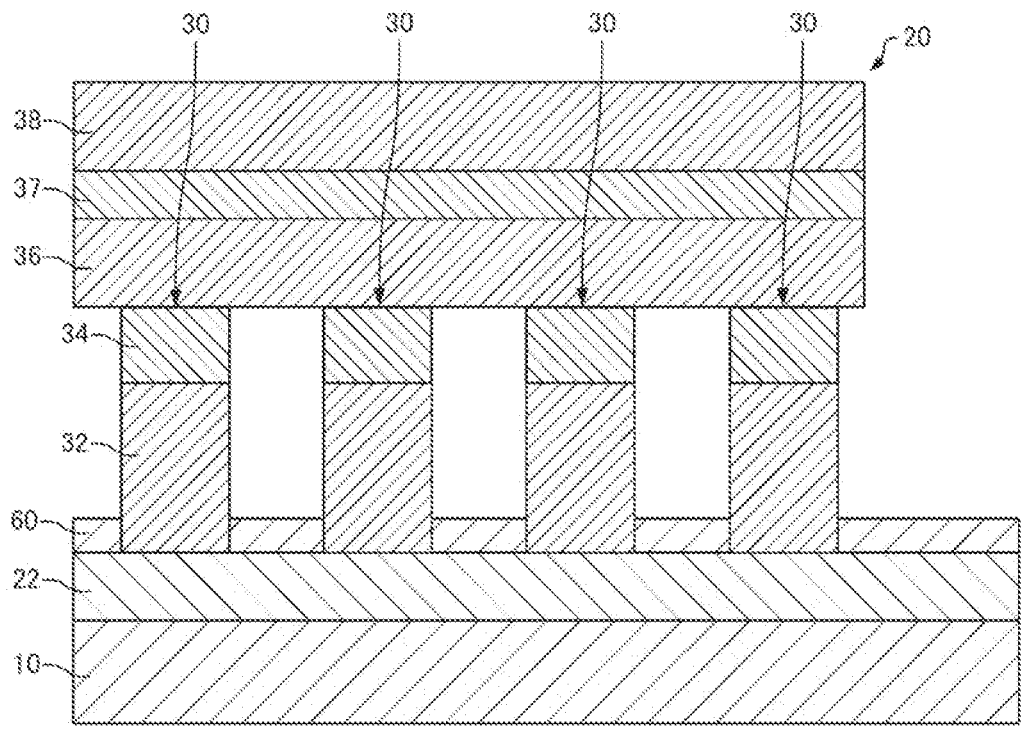
FIG. 4 is a cross-sectional view diagrammatically showing one of the steps of manufacturing the light emitting apparatus according to the first embodiment.

A method for manufacturing the light emitting apparatus 100 according to the first embodiment will next be described with reference to the drawings. FIGS. 3 and 4 are cross-sectional views diagrammatically each showing one of the steps of manufacturing the light emitting apparatus 100 according to the first embodiment.

The buffer layer 22 is epitaxially grown on the substrate 10, as shown in FIG. 3. Examples of the epitaxial growth method may include a metal organic chemical vapor deposition (MOCVD) method and a molecular beam epitaxy (MBE) method.

The mask layer 60 is then formed on the buffer layer 22. The mask layer 60 is provided with a plurality of holes for forming columnar sections 30.

The mask layer 60 is used as a mask to epitaxially grow the first semiconductor layers 32, the light emitting layers 34, the second semiconductor layer 36, the tunnel junction layer 37, and the third semiconductor layer 38 on the buffer layer 22, as shown in FIG. 4. Examples of the epitaxial growth method may include the MOCVD and MBE methods.

To epitaxially grow the first semiconductor layers 32 and the light emitting layers 34, the epitaxial growth is performed under conditions that allow the layers 32 and to grow in the lamination direction. The first semiconductor layers 32 and the light emitting layers 34 thus form the columnar sections 30. To epitaxially grow the second semiconductor layer 36, the epitaxial growth is performed under conditions that allow the layer 36 to grow not only in the lamination direction but in the in-plane direction perpendicular to the lamination direction. The second semiconductor layer 36 thus forms a single layer so provided not as to form the columnar sections 30 but to extend over the plurality of columnar sections 30. The tunnel junction layer 37 and the third semiconductor layer formed on the second semiconductor layer 36 are each formed as a single layer that extends over the plurality of columnar sections 30, as in the case of the second semiconductor layer 36.

The electrode 50 is formed on the buffer layer 22, as shown in FIG. 1. The electrode 50 is formed, for example, in vacuum evaporation.

The light emitting apparatus 100 can be manufactured by carrying out the steps described above.

2. Second Embodiment

2.1. Light Emitting Apparatus

Figure 5:
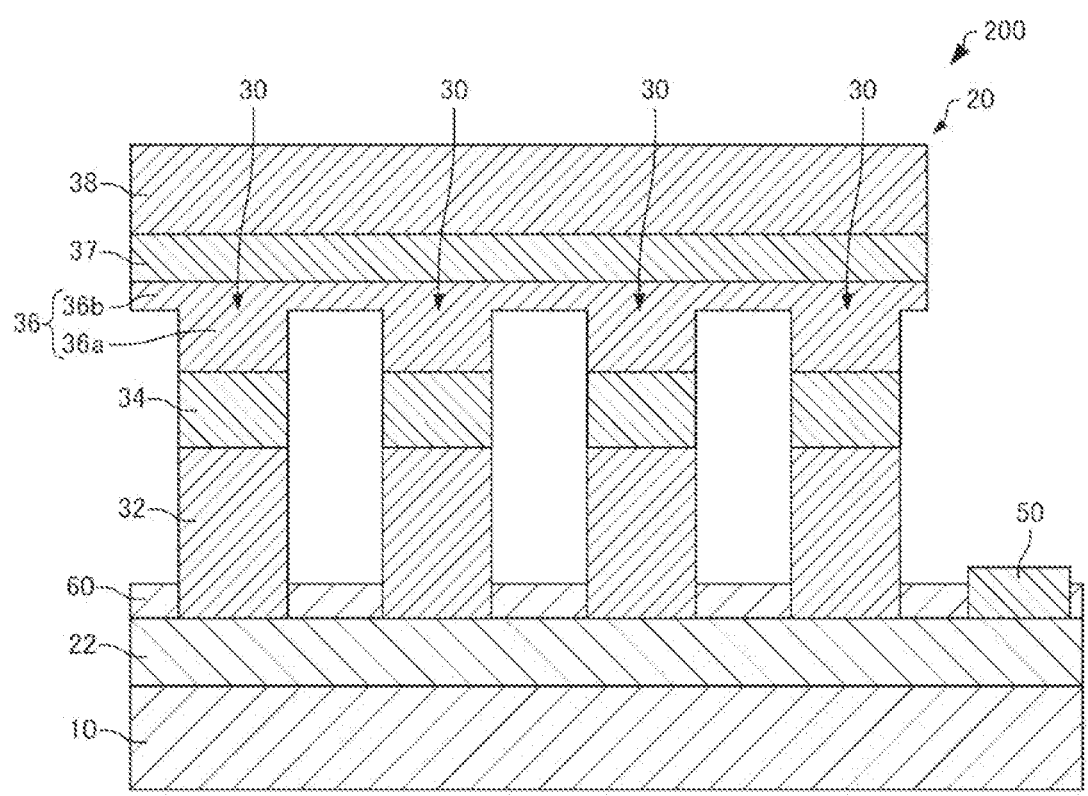
FIG. 5 is a cross-sectional view diagrammatically showing a light emitting apparatus according to a second embodiment.

A light emitting apparatus according to a second embodiment will next be described with reference to the drawings. FIG. 5 is a cross-sectional view diagrammatically showing a light emitting apparatus 200 according to the second embodiment. In the following description of the light emitting apparatus 200 according to the second embodiment, a member having the same function as that of a constituent member of the light emitting apparatus 100 according to the first embodiment described above has the same reference character and will not be described in detail.

In the light emitting apparatus 100 described above, the first semiconductor layers 32 and the light emitting layers 34 form the columnar sections 30, as shown in FIG. 1.

In contrast, in the light emitting apparatus 200, the first semiconductor layers 32, the light emitting layers 34, and part of the second semiconductor layer 36 form the columnar sections 30, as shown in FIG. 5.

The second semiconductor layer 36 includes columnar sections 36a and a layer-shaped section 36b, as shown in FIG. 5.

The columnar sections 36a are sections of the second semiconductor layer 36 that are the sections forming the columnar sections 30. The columnar sections 36a are in contact with the light emitting layers 34. The layer-shaped section 36b is a section of the second semiconductor layer 36 that is the section having the shape of a layer and so provided as to extend over the plurality of columnar sections 30. That is, the layer-shaped section 36b does not form the columnar sections 30. The layer-shaped section 36b is in contact with the tunnel junction layer 37.

The light emitting apparatus 200 allows reduction in the loss of the light propagating between the columnar sections 30, as the light emitting apparatus 100 described above does.

2.2. Method for Manufacturing Light Emitting Apparatus

In a method for manufacturing the light emitting apparatus 200, to epitaxially grow the second semiconductor layer 36, the epitaxial growth is performed under conditions that allow the layer 36 to grow in the lamination direction to form the columnar sections 36a, and the epitaxial growth is then performed under the conditions that allow the layer 36 to grow not only in the lamination direction but in the in-plane direction to form the layer-shaped section 36b. The other steps are the same as those of the method for manufacturing the light emitting apparatus 100 described above.

3. Third Embodiment

3.1. Light Emitting Apparatus

Figure 6:
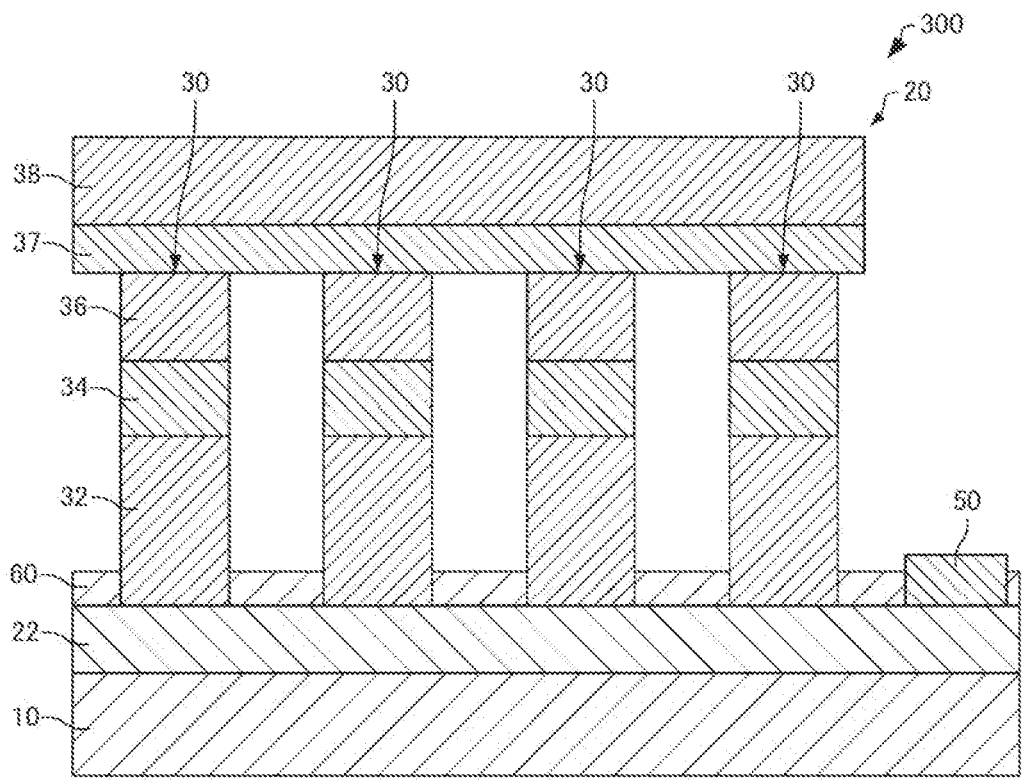
FIG. 6 is a cross-sectional view diagrammatically showing a light emitting apparatus according to a third embodiment.

A light emitting apparatus according to a third embodiment will next be described with reference to the drawings. FIG. 6 is a cross-sectional view diagrammatically showing a light emitting apparatus 300 according to the third embodiment. In the following description of the light emitting apparatus 300 according to the third embodiment, a member having the same function as that of a constituent member of the light emitting apparatus 100 according to the first embodiment described above has the same reference character and will not be described in detail.

In the light emitting apparatus 100 described above, the first semiconductor layers 32 and the light emitting layers 34 form the columnar sections 30, as shown in FIG. 1.

In contrast, in the light emitting apparatus 300, the first semiconductor layers 32, the light emitting layers 34, and the second semiconductor layers 36 form the columnar sections 30, as shown in FIG. 6.

The light emitting apparatus 300 allows reduction in the loss of the light propagating between the columnar sections 30, as the light emitting apparatus 100 described above does.

3.2. Method for Manufacturing Light Emitting Apparatus

In a method for manufacturing the light emitting apparatus 300, to epitaxially grow the second semiconductor layers 36, the epitaxial growth is performed under conditions that allow the layer 36 to grow in the lamination direction, and to epitaxially grow the tunnel junction layer 37, the epitaxial growth is performed under conditions that allow the layer 37 to grow not only in the lamination direction but in the in-plane direction. The other steps are the same as those of the method for manufacturing the light emitting apparatus 100 described above.

4. Fourth Embodiment

4.1. Light Emitting Apparatus

Figure 7:
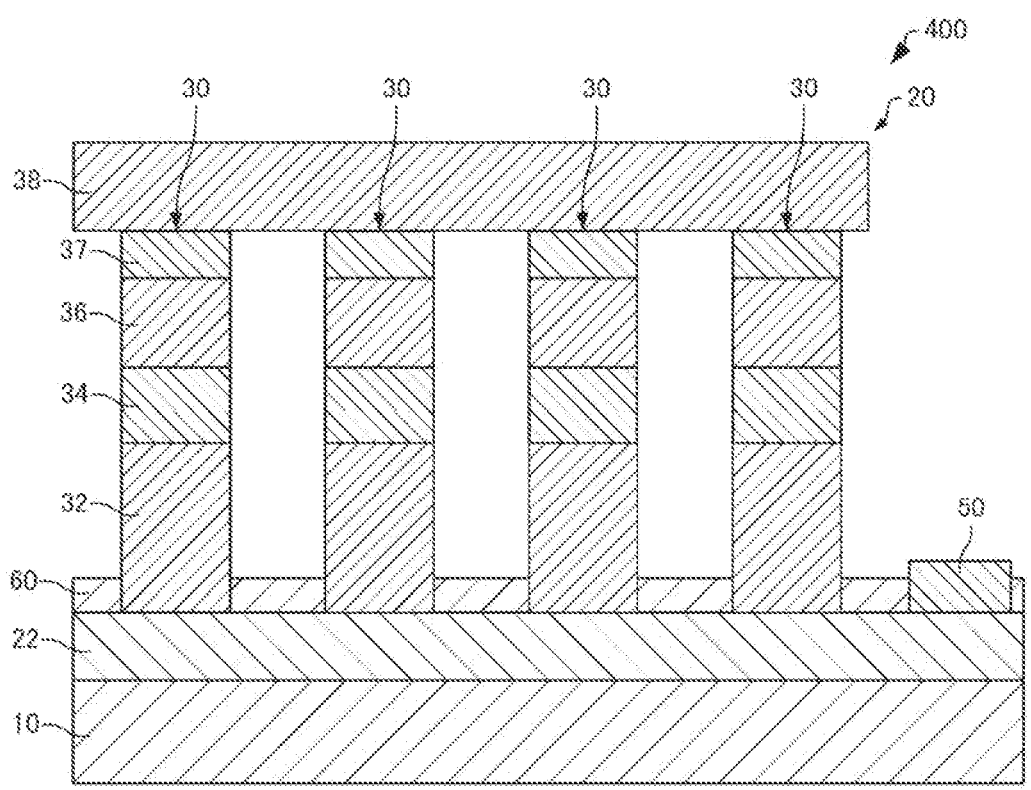
FIG. 7 is a cross-sectional view diagrammatically showing a light emitting apparatus according to a fourth embodiment.

A light emitting apparatus according to a fourth embodiment will next be described with reference to the drawings. FIG. 7 is a cross-sectional view diagrammatically showing a light emitting apparatus 400 according to the fourth embodiment. In the following description of the light emitting apparatus 400 according to the fourth embodiment, a member having the same function as that of a constituent member of the light emitting apparatus 100 according to the present embodiment described above has the same reference character and will not be described in detail.

In the light emitting apparatus 100 described above, the first semiconductor layers 32 and the light emitting layers 34 form the columnar sections 30, as shown in FIG. 1.

In contrast, in the light emitting apparatus 400, the first semiconductor layers 32, the light emitting layers 34, the second semiconductor layers 36, and the tunnel junction layers 37 form the columnar sections 30, as shown in FIG. 7.

Figure 8:
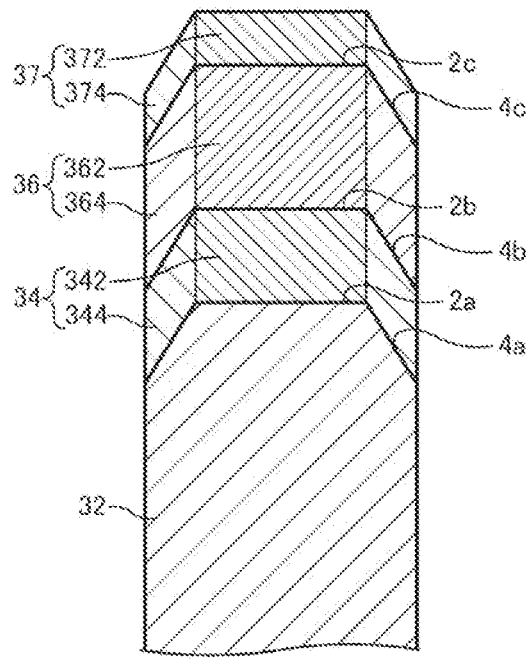
FIG. 8 is a cross-sectional view diagrammatically showing a columnar section.

FIG. 8 is a cross-sectional view diagrammatically showing one of the columnar sections 30.

The first semiconductor layer 32 is, for example, made of a GaN crystal having a wurtzite crystal structure. The first semiconductor layer 32 has a c surface 2a and a facet surface 4a. The c surface 2a is, for example, parallel to the principal surface of the substrate 10 shown in FIG. 7. The principal surface of the substrate 10 is the surface on which the laminated structure 20 is provided. The facet surface 4a, for example, inclines with respect to the principal surface of the substrate 10.

The light emitting layer 34 has a c surface area 342, which is provided on the c surface 2a of the first semiconductor layer 32, and a facet surface area 344, which is provided on the facet surface 4a of the first semiconductor layer 32. The c surface area 342 is an area of the light emitting layer 34 that is an area having undergone crystal growth under the influence of the c surface 2a of the first semiconductor layer 32. The facet surface area 344 is an area of the light emitting layer 34 that is an area having undergone crystal growth under the influence of the facet surface 4a of the first semiconductor layer 32. The c surface area 342 is surrounded by the facet surface area 344 when viewed in the lamination direction.

The c surface area 342, which undergoes crystal growth under the influence of the c surface 2a of the first semiconductor layer 32, is likely to capture In, as compared with the facet surface 344. The In concentration of the c surface area 342 is therefore higher than the In concentration of the facet surface area 344.

The light emitting layer 34 has a c surface 2b and a facet surface 4b. The c surface 2b is, for example, parallel to the principal surface of the substrate 10 shown in FIG. 7. The facet surface 4b, for example, inclines with respect to the principal surface of the substrate 10.

The second semiconductor layer 36 has a c surface area 362, which is provided on the c surface 2b of the light emitting layer 34, and a facet surface area 364, which is provided on the facet surface 4b of the light emitting layer 34. The c surface area 362 is an area of the second semiconductor layer 36 that is an area having undergone crystal growth under the influence of the c surface 2b of the light emitting layer 34. The facet surface area 364 is an area of the second semiconductor layer 36 that is an area having undergone crystal growth under the influence of the facet surface 4b of the light emitting layer 34. The c surface area 362 is surrounded by the facet surface area 364 when viewed in the lamination direction.

The second semiconductor layer 36 has a c surface 2c and a facet surface 4c. The c surface 2c is, for example, parallel to the principal surface of the substrate 10 shown in FIG. 7. The facet surface 4c, for example, inclines with respect to the principal surface of the substrate 10.

The tunnel junction layer 37 has a c surface area 372, which is provided on the c surface 2c of the second semiconductor layer 36, and a facet surface area 374, which is provided on the facet surface 4c of the second semiconductor layer 36. The c surface area 372 is an area of the tunnel junction layer 37 that is an area having undergone crystal growth under the influence of the c surface 2c of the second semiconductor layer 36. The facet surface area 374 is an area of the tunnel junction layer 37 that is an area having undergone crystal growth under the influence of the facet surface 4c of the second semiconductor layer 36. The c surface area 372 is surrounded by the facet surface area 374 when viewed in the lamination direction.

The c surface area 372, which undergoes crystal growth under the influence of the c surface 2c of the second semiconductor layer 36, is likely to capture impurities, as compared with the facet surface area 374. The impurity concentration of the c surface area 372 is therefore higher than the impurity concentration of the facet surface area 374. The c surface area 372 is therefore likely to provide the tunnel effect as compared with the facet surface area 374. That is, the electrical resistance of the c surface area 372 is smaller than the electrical resistance of the facet surface area 374. A current narrowing structure that selectively injects current from the c surface area 372 can therefore be formed in the tunnel junction layer 37. As a result, current can be efficiently injected into the c surface area 342 of the light emitting layer 34, which is the area having the high In concentration.

Further, in the light emitting apparatus 400, the tunnel junction layers 37 form the columnar sections 30. Therefore, in the light emitting apparatus 400, the tunnel junction layers 37 can be made of a high-quality crystal having a reduced amount of crystal defects, whereby deterioration of the characteristics of the tunnel junction layers 37 due to introduction of crystal deflects can be reduced.

The light emitting apparatus 400 allows reduction in the loss of the light propagating between the columnar sections 30, as the light emitting apparatus 100 does.

4.2. Method for Manufacturing Light Emitting Apparatus

In a method for manufacturing the light emitting apparatus 400, to epitaxially grow the second semiconductor layers 36 and the tunnel junction layers 37, the epitaxial growth is performed under conditions that allow the layers and 37 to grow in the lamination direction. To epitaxially grow the third semiconductor layer 38, the epitaxial growth is performed under conditions that allow the layer 38 to grow not only in the lamination direction but in the in-plane direction. The other steps are the same as those of the method for manufacturing the light emitting apparatus 100 described above.

5. Fifth Embodiment

5.1. Light Emitting Apparatus

Figure 9:
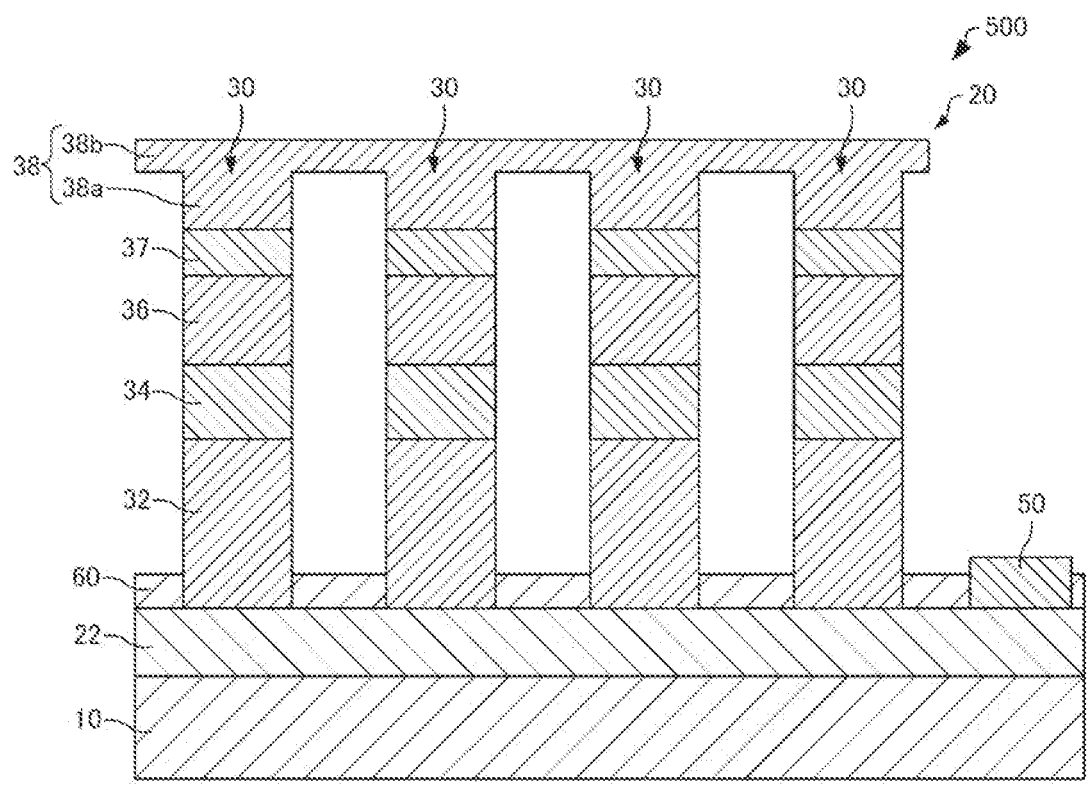
FIG. 9 is a cross-sectional view diagrammatically showing a light emitting apparatus according to a fifth embodiment.

A light emitting apparatus according to a fifth embodiment will next be described with reference to the drawings. FIG. 9 is a cross-sectional view diagrammatically showing a light emitting apparatus 500 according to the fifth embodiment. In the following description of the light emitting apparatus 500 according to the fifth embodiment, a member having the same function as that of a constituent member of the light emitting apparatus 100 according to the present embodiment described above has the same reference character and will not be described in detail.

In the light emitting apparatus 100 described above, the first semiconductor layers 32 and the light emitting layers 34 form the columnar sections 30, as shown in FIG. 1.

In contrast, in the light emitting apparatus 500, the first semiconductor layers 32, the light emitting layers 34, the second semiconductor layers 36, the tunnel junction layers 37, and part of the third semiconductor layer 38 form the columnar sections 30, as shown in FIG. 9.

The third semiconductor layer 38 includes columnar sections 38a and a layer-shaped section 38b, as shown in FIG. 9.

The columnar sections 38a are sections of the third semiconductor layer 38 that are the sections forming the columnar sections 30. The columnar sections 38a are in contact with the tunnel junction layers 37. The layer-shaped section 38b is a section of the third semiconductor layer 38 that is the section having the shape of a layer and so provided as to extend over the plurality of columnar sections 30. That is, the layer-shaped section 38b does not form the columnar sections 30. In the light emitting apparatus 500, the layer-shaped section 38b diffuses current in the in-plane direction and supplies the plurality of columnar sections 30 with the current.

In the light emitting apparatus 500, the second semiconductor layers 36, the tunnel junction layers 37, and part of the third semiconductor layer 38 form the columnar sections 30. The in-plane-direction average refractive index of the portion above the light emitting layers 34 in the laminated structure 20, that is, the portion shifted from the light emitting layers 34 toward the third semiconductor layer 38 can therefore be lowered as compared, for example, with the case where the third semiconductor layer 38 does not form the columnar sections 30. Leakage of the light produced in the light emitting layers 34 toward the third semiconductor layer 38 can therefore be reduced in the light emitting apparatus 500.

In the light emitting apparatus 500, the tunnel junction layers 37 form the columnar sections 30, whereby a current narrowing structure can be formed in each of the tunnel junction layers 37, as in the light emitting apparatus 400.

In the light emitting apparatus 500, in which the tunnel junction layers 37 form the columnar sections 30, the tunnel junction layers 37 can be made of a high-quality crystal having a reduced amount of crystal defects, whereby deterioration of the characteristics of the tunnel junction layers 37 due to introduction of crystal deflects can be reduced.

The light emitting apparatus 500 allows reduction in the loss of the light propagating between the columnar sections 30, as the light emitting apparatus 100 does.

5.2. Method for Manufacturing Light Emitting Apparatus

In a method for manufacturing the light emitting apparatus 500, to epitaxially grow the second semiconductor layers 36 and the tunnel junction layers 37, the epitaxial growth is performed under conditions that allow the layers 36 and 37 to grow in the lamination direction. To epitaxially grow the third semiconductor layer 38, the epitaxial growth is performed under conditions that allow the layer 38 to grow in the lamination direction to form the columnar sections 38a, and the epitaxial growth is then performed under conditions that allow the layer 38 to grow not only in the lamination direction but in the in-plane direction to form the layer-shaped section 38b. The other steps are the same as those of the method for manufacturing the light emitting apparatus 100 described above.

6. Sixth Embodiment

6.1. Light Emitting Apparatus

Figure 10:
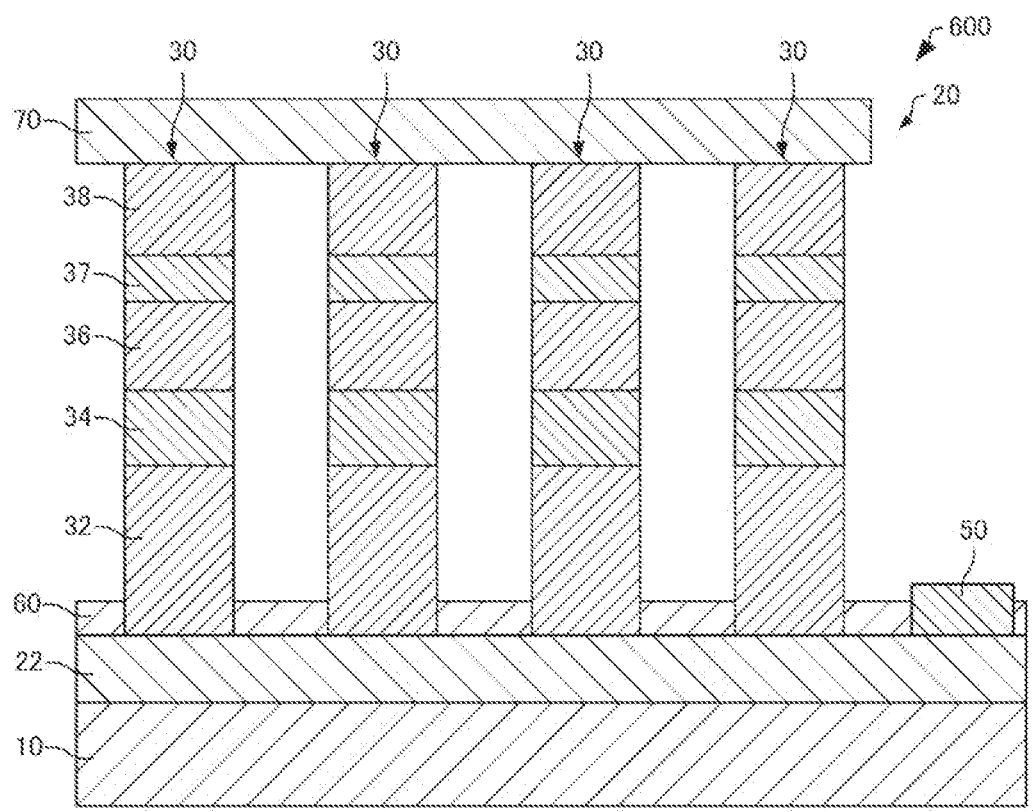
FIG. 10 is a cross-sectional view diagrammatically showing a light emitting apparatus according to a sixth embodiment.

A light emitting apparatus according to a sixth embodiment will next be described with reference to the drawings. FIG. 10 is a cross-sectional view diagrammatically showing a light emitting apparatus 600 according to a sixth embodiment. In the following description of the light emitting apparatus 600 according to the sixth embodiment, a member having the same function as that of a constituent member of the light emitting apparatus 100 according to the present embodiment described above has the same reference character and will not be described in detail.

In the light emitting apparatus 100 described above, the first semiconductor layers 32 and the light emitting layers 34 form the columnar sections 30, as shown in FIG. 1.

In contrast, in the light emitting apparatus 600, the first semiconductor layers 32, the light emitting layers 34, the second semiconductor layers 36, the tunnel junction layers 37, and the third semiconductor layers 38 form the columnar sections 30, as shown in FIG. 10. The light emitting apparatus 600 includes the electrode 50 (hereinafter also referred to as "first electrode 50") and a second electrode 70, which is an electrode that diffuses current in the in-plane direction and supplies the plurality of columnar sections 30 with the current.

The second electrode 70 is a transparent electrode that transmits the light produced in the light emitting layer 34. The second electrode 70 is made, for example, of ITO. The second electrode 70 is a single layer so provided as to extend over the plurality of columnar sections 30.

In the light emitting apparatus 600, the third semiconductor layers 38 are provided between the light emitting layers 34 and the second electrode 70. The second electrode 70 can therefore be shifted away from the light emitting layers 34 as compared with a case where no third semiconductor layer 38 is provided between the light emitting layers 34 and the second electrode 70. Therefore, in the light emitting apparatus 600, leakage of the light propagating between the columnar sections 30 to the second electrode 70 can be reduced, whereby the loss of the light propagating between the columnar sections 30 can be reduced.

In the light emitting apparatus 600, the tunnel junction layers 37 form the columnar sections 30, whereby a current narrowing structure can be formed in each of the tunnel junction layers 37, as in the light emitting apparatuses 400 and 500.

In the light emitting apparatus 600, in which the tunnel junction layers 37 form the columnar sections 30, the tunnel junction layers 37 can be made of a high-quality crystal having a reduced amount of crystal defects, whereby deterioration of the characteristics of the tunnel junction layers 37 due to introduction of crystal deflects can be reduced, as in the light emitting apparatuses 400 and 500.

In the light emitting apparatus 600, the second semiconductor layers 36, the tunnel junction layers 37, and the third semiconductor layers 38 form the columnar sections 30. The in-plane-direction average refractive index of the portion shifted from the light emitting layers 34 toward the third semiconductor layers 38 in the laminated structure 20 can therefore be lowered as compared, for example, with the case where the third semiconductor layers 38 do not form the columnar sections 30. Leakage of the light produced in the light emitting layers 34 toward the third semiconductor layers 38 can therefore be reduced in the light emitting apparatus 600.

The light emitting apparatus 600 allows reduction in the loss of the light propagating between the columnar sections 30, as the light emitting apparatus 100 does.

6.2. Method for Manufacturing Light Emitting Apparatus

In a method for manufacturing the light emitting apparatus 600, to epitaxially grow the second semiconductor layers 36, the tunnel junction layers 37, and the third semiconductor layers 38, the epitaxial growth is performed under conditions that allow the layers 36, 37, and 38 to grow in the lamination direction. The second electrode 70 is formed on the columnar sections 30. The second electrode 70 is formed, for example, in vacuum evaporation. The other steps are the same as those of the method for manufacturing the light emitting apparatus 100 described above.

7. Seventh Embodiment

Figure 11:
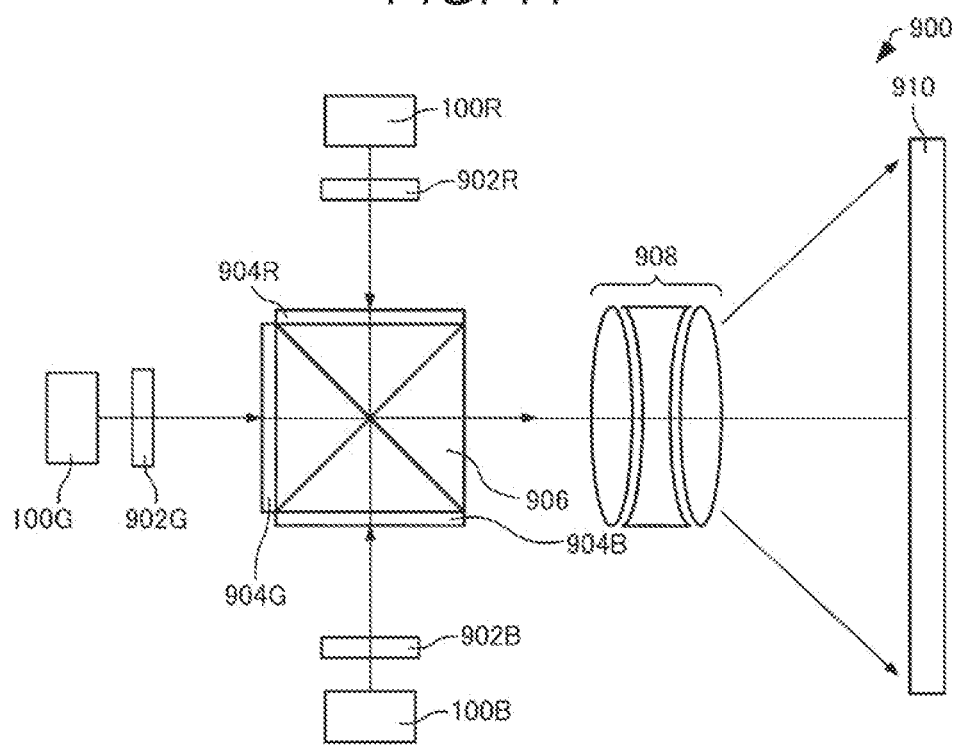
FIG. 11 diagrammatically shows a projector according to a seventh embodiment.

A projector according to a seventh embodiment will next be described with reference to the drawings. FIG. 11 diagrammatically shows a projector 900 according to the seventh embodiment.

The projector 900 includes, for example, the light emitting apparatus 100 as a light source.

The projector 900 includes an enclosure that is not shown and a red light source 100R, a green light source 100G, and a blue light source 100B, which are provided in the enclosure and emit red light, green light, and blue light, respectively. In FIG. 11, the red light source 100R, the green light source 100G, and the blue light source 100B are simplified for convenience.

The projector 900 further includes a first optical element 902R, a second optical element 902G, a third optical element 902B, a first light modulator 904R, a second light modulator 904G, a third light modulator 904B, and a projection apparatus 908, which are provided in the enclosure. The first light modulator 904R, the second light modulator 904G, and the third light modulator 904B are, for example, each a transmissive liquid crystal light valve. The projection apparatus 908 is, for example, a projection lens.

Light outputted from the red light source 100R enters the first optical element 902R. The light outputted from the red light source 100R is collected by the first optical element 902R. The first optical element 902R may have another function in addition to the light collection function. The same holds true for the second optical element 902G and the third optical element 902B, which will be described later.

The light collected by the first optical element 902R is incident on the first light modulator 904R. The first light modulator 904R modulates the light incident thereon in accordance with image information. The projection apparatus 908 then enlarges an image formed by the first light modulator 904R and projects the enlarged image on a screen 910.

Light outputted from the green light source 100G enters the second optical element 902G. The light outputted from the green light source 100G is collected by the second optical element 902G.

The light collected by the second optical element 902G is incident on the second light modulator 904G. The second light modulator 904G modulates the light incident thereon in accordance with image information. The projection apparatus 908 then enlarges an image formed by the second light modulator 904G and projects the enlarged image on the screen 910.

Light outputted from the blue light source 100B enters the third optical element 902B. The light outputted from the blue light source 100B is collected by the third optical element 902B.

The light collected by the third optical element 902B is incident on the third light modulator 904B. The third light modulator 904B modulates the light incident thereon in accordance with image information. The projection apparatus 908 then enlarges an image formed by the third light modulator 904B and projects the enlarged image on the screen 910.

The projector 900 can include a cross dichroic prism 906, which combines the light fluxes outputted from the first light modulator 904R, the second light modulator 904G, and the third light modulator 904B with one another and guides the combined light to the projection apparatus 908.

The three color light fluxes modulated by the first light modulator 904R, the second light modulator 904G, the third light modulator 904B enter the cross dichroic prism 906. The cross dichroic prism 906 is formed by bonding four right-angle prisms to each other, and a dielectric multilayer film that reflects the red light flux and a dielectric multilayer film that reflects the blue light flux are disposed on the inner surfaces of the combined prisms. The dielectric multilayer films combine the three color light fluxes with one another to form light representing a color image. The combined light is then projected by the projection apparatus 908 on the screen 910, whereby an enlarged image is displayed.

The case where the projector 900 includes the light emitting apparatus 100 as a light source has been described above, and the projector 900 may include any of the light emitting apparatuses 200, 300, 400, 500, and 600 as the light source.

The red light source 100R, the green light source 100G, and the blue light source 100B may differ from one another in terms of the film thickness and impurity concentration of the tunnel junction layer 37.

In the tunnel junction layer 37, a decrease in film thickness causes a decrease in light absorption but an increase in electrical resistance. In the tunnel junction layer 37, a decrease in impurity concentration causes a decrease in light absorption but an increase in electrical resistance.

The amount of light absorbed by the tunnel junction layer 37 decreases as the wavelength of the light increases. Therefore, in a light source that oscillates at a long wavelength, the film thickness and the impurity concentration of the tunnel junction layer 37 can be greater but the electrical resistance thereof can be smaller than in a light source that oscillates at a short wavelength. For example, let $T_R$ and $N_R$ be the film thickness and the impurity concentration of the tunnel junction layer 37 in the red light source 100R, $T_G$ and $N_G$ be the film thickness and the impurity concentration of the tunnel junction layer 37 in the green light source 100G, and $T_B$ and $N_B$ be the film thickness and the impurity concentration of the tunnel junction layer 37 in the blue light source 100B, and $T_R>T_G>T_B$ and $N_R>N_G>N_B$ may be satisfied.

The red light source 100R, the green light source 100G, and the blue light source 100B may instead each directly form video images without use of the first light modulator 904R, the second light modulator 904G, or the third light modulator 904B by controlling the light emitting apparatuses 100 as the pixels of the video images in accordance with the image information. The projection apparatus 908 may then enlarge and project the video images formed by the red light source 100R, the green light source 100G, and the blue light source 100B on the screen 910.

In the example described above, transmissive liquid crystal valves are used as the light modulators, and light valves based on any other technology other than the liquid crystal technology or reflective light valves may be used. Examples of such light valves may include reflective liquid crystal light valves and digital micromirror devices. The configuration of the projection apparatus is changed as appropriate in accordance with the type of the light valves used therein.

The present disclosure is also applicable to a light source apparatus of a scanning-type image display apparatus including a light source and a scanner that is an image formation apparatus that displays an image having a desired size on a display surface by scanning the screen with the light from the light source.

The light emitting apparatus according to any of the embodiments described above can be used in another application in addition to a projector. Examples of the application other than a projector may include an indoor or outdoor illuminator, a backlight of a display, a laser printer, a scanner, an in-vehicle light, a sensing instrument using light, and a light source of a communication instrument.

The embodiments and variations described above are presented by way of example, and the present disclosure is not limited thereto. For example, the embodiments and variations can be combined with each other as appropriate.

Further, for example, in the embodiments and variations described above, the first semiconductor layers 32, the light emitting layers 34, the second semiconductor layer 36, the tunnel junction layer 37, and the third semiconductor layer 38, are arranged in the presented order from the side facing the substrate 10 in the laminated structure 20 provided on the substrate 10, but not necessarily, and the third semiconductor layer 38, the tunnel junction layer 37, the second semiconductor layer 36, the light emitting layers 34, and the first semiconductor layers 32 may be arranged in the presented order from the side facing the substrate 10.

The present disclosure encompasses substantially the same configuration as the configuration described in any of the embodiments, for example, a configuration having the same function, using the same method, and providing the same result or a configuration having the same purpose and providing the same effect. Further, the present disclosure encompasses a configuration in which an inessential portion of the configuration described in any of the embodiments is replaced. Moreover, the present disclosure encompasses a configuration that provides the same effects and advantages as those provided by the configuration described in any of the embodiments or a configuration that can achieve the same purpose as that achieved by the configuration described in any of the embodiments. Further, the present disclosure encompasses a configuration in which a known technology is added to the configuration described in any of the embodiments.

The following contents are derived from the embodiments and variations described above.

An aspect of the light emitting apparatus includes an electrode and a laminated structure. The laminated structure includes an n-type first semiconductor layer, a light emitting layer, a p-type second semiconductor layer, a tunnel junction layer, and an n-type third semiconductor layer. The electrode is electrically connected to the first semiconductor layer. The first semiconductor layer, the light emitting layer, the second semiconductor layer, the tunnel junction layer, and the third semiconductor layer are arranged in the presented order. The light emitting layer and the first semiconductor layer form a columnar section.

In the light emitting apparatus described above, the p-type second semiconductor layer is joined in the form of a tunnel junction to the n-type third semiconductor layer via the tunnel junction layer, whereby the n-type third semiconductor layer can inject current into the p-type second semiconductor layer via the tunnel junction layer. The third semiconductor layer can therefore be used as an electrode for injecting current into the light emitting layer. Since the n-type third semiconductor layer has an extremely small light absorption coefficient, whereby loss of the light propagating between the columnar sections can be reduced as compared, for example, with the case where an electrode made of ITO is used.

In the aspect of the light emitting apparatus, at least part of the second semiconductor layer may form the columnar section.

In the aspect of the light emitting apparatus, the second semiconductor layer and the tunnel junction layer may form the columnar section.

In the light emitting apparatus described above, in which the tunnel junction layer forms the columnar section, the tunnel junction layer can be made of a high-quality crystal having a reduced amount of crystal defects, whereby deterioration of the characteristics of the tunnel junction layer due to introduction of crystal deflects can be reduced.

In the aspect of the light emitting apparatus, the second semiconductor layer may have a c surface and a facet surface, the tunnel junction layer has a c surface area provided on the c surface and a facet surface area provided on the facet surface, and the impurity concentration of the c surface area may be higher than the impurity concentration of the facet surface area.

In the light emitting apparatus described above, a current narrowing structure that selectively injects current from the c surface area can be formed in the tunnel junction layer.

In the aspect of the light emitting apparatus, the second semiconductor layer, the tunnel junction layer, and at least part of the third semiconductor layer may form the columnar section.

In the light emitting apparatus described above, the in-plane-direction average refractive index of the portion shifted from the light emitting layers toward the third semiconductor layers in the laminated structure can therefore be lowered as compared, for example, with a case where the third semiconductor layers not form the columnar section.

In the aspect of the light emitting apparatus, the tunnel junction layer may join the second semiconductor layer in the form of a tunnel junction to the third semiconductor layer.

In the light emitting apparatus described above, the n-type third semiconductor layer can inject current into the p-type second semiconductor layer via the tunnel junction layer.

An aspect of a projector has the aspect of the light emitting apparatus.

What is claimed is:
1. A light emitting apparatus comprising:
an electrode; and
a laminated structure,
wherein the laminated structure includes:
an n-type first semiconductor layer;
a light emitting layer;
a p-type second semiconductor layer;

a tunnel junction layer; and an n-type third semiconductor layer, the electrode is electrically connected to the first semiconductor layer, the first semiconductor layer, the light emitting layer, the second semiconductor layer, the tunnel junction layer, and the third semiconductor layer are arranged in a presented order, the first semiconductor layer, the light emitting layer, the second semiconductor layer, and the tunnel junction layer form a columnar section, the second semiconductor layer has a c surface and a facet surface, the tunnel junction layer has, a c surface area provided on the c surface, and a facet surface area provided on the facet surface, and an impurity concentration of the c surface area is higher than an impurity concentration of the facet surface area.

2. The light emitting apparatus according to claim 1, wherein the columnar section further includes at least part of the third semiconductor layer to integrally form the columnar section with the first semiconductor layer, the light emitting layer, the second semiconductor layer, and the tunnel junction layer.

3. The light emitting apparatus according to claim 1, wherein the tunnel junction layer joins the second semiconductor layer in a form of a tunnel junction to the third semiconductor layer.

4. A projector comprising the light emitting apparatus according to claim 1.

* * * * *